(12) United States Patent
Park

(10) Patent No.: US 12,156,477 B2
(45) Date of Patent: Nov. 26, 2024

(54) SEMICONDUCTOR DEVICE AND A METHOD OF OPERATING THE SAME

(71) Applicant: Samsung Electronics Co., Ltd., Suwon-si (KR)

(72) Inventor: Jiho Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 254 days.

(21) Appl. No.: 17/314,320

(22) Filed: May 7, 2021

(65) Prior Publication Data

US 2022/0123205 A1    Apr. 21, 2022

(30) Foreign Application Priority Data

Oct. 16, 2020 (KR) .................. 10-2020-0134688

(51) Int. Cl.
*H10B 61/00* (2023.01)
*H10N 50/10* (2023.01)
*H10N 50/80* (2023.01)
*H10N 50/85* (2023.01)

(52) U.S. Cl.
CPC ............. *H10N 50/10* (2023.02); *H10B 61/20* (2023.02); *H10N 50/80* (2023.02); *H10N 50/85* (2023.02)

(58) Field of Classification Search
CPC .......... G11C 2211/5615; G11C 11/161; H10N 50/10; H10N 50/00–20; H10N 52/00–85; H10B 61/00–22; H01L 28/90–92; H01L 29/66181; H01L 29/945; G01R 33/098; G11B 5/3909

See application file for complete search history.

(56) References Cited

U.S. PATENT DOCUMENTS

| | | |
|---|---|---|
| 8,030,186 B2 | 10/2011 | Romano et al. |
| 8,090,186 B2 | 1/2012 | Nagano et al. |
| 9,076,537 B2 | 7/2015 | Khvalkovskiy et al. |
| 9,105,830 B2 | 8/2015 | Khvalkovskiy et al. |
| 9,130,155 B2 | 9/2015 | Chepulskyy et al. |
| 9,305,629 B2 | 4/2016 | Manipatruni et al. |
| 10,062,731 B2 | 8/2018 | Manipatruni et al. |
| 10,170,185 B2 | 1/2019 | Manipatruni et al. |

(Continued)

FOREIGN PATENT DOCUMENTS

| | | |
|---|---|---|
| KR | 10-1825318 B1 | 2/2018 |
| TW | 200416786 A | 9/2004 |

(Continued)

OTHER PUBLICATIONS

Yeongkyo Seo et al., "Area-Efficient SOT-MRAM With a Schottky Diode" IEEE Electron Device Letters, vol. 37, No. 8, Aug. 2016.

*Primary Examiner* — Eric A. Ward
*Assistant Examiner* — Nora T. Nix
(74) *Attorney, Agent, or Firm* — Harness, Dickey & Pierce, P.L.C.

(57) ABSTRACT

A semiconductor device includes a conductive pattern extending in a first direction, a magnetic tunnel junction pattern on the conductive pattern, and a capacitor on the magnetic tunnel junction pattern. The magnetic tunnel junction pattern is between the conductive pattern and the capacitor, and the magnetic tunnel junction pattern connects to the capacitor, and the conductive pattern is configured to apply spin-orbit torque to the magnetic tunnel junction pattern.

20 Claims, 13 Drawing Sheets

(56) References Cited

U.S. PATENT DOCUMENTS

| | | | |
|---|---|---|---|
| 10,468,103 B2 | 11/2019 | Kim et al. | |
| 10,749,048 B2 | 8/2020 | Allemand et al. | |
| 2007/0045759 A1* | 3/2007 | Chung | H10B 61/22 |
| | | | 257/E27.005 |
| 2016/0260771 A1* | 9/2016 | Fukuzawa | H10N 50/10 |
| 2016/0300612 A1* | 10/2016 | Manipatruni | G11C 14/0045 |
| 2018/0190899 A1 | 7/2018 | Kim et al. | |
| 2018/0342556 A1* | 11/2018 | Tan | H01L 28/60 |
| 2019/0067375 A1 | 2/2019 | Karda et al. | |
| 2019/0148046 A1 | 5/2019 | Suzuki | |
| 2020/0006636 A1 | 1/2020 | Gosavi et al. | |
| 2020/0194666 A1 | 6/2020 | Araki | |
| 2020/0313075 A1* | 10/2020 | Sato | G11C 11/161 |
| 2021/0074766 A1* | 3/2021 | Pillarisetty | G11C 13/0002 |

FOREIGN PATENT DOCUMENTS

| | | |
|---|---|---|
| TW | 200839794 A | 10/2008 |
| WO | WO-2019/125388 A1 | 6/2019 |

\* cited by examiner

SEMICONDUCTOR DEVICE AND A METHOD OF OPERATING THE SAME

CROSS-REFERENCE TO RELATED APPLICATION

This U.S. non-provisional patent application claims priority under 35 U.S.C. § 119 to Korean Patent Application No. 10-2020-0134688, filed on Oct. 16, 2020, in the Korean Intellectual Property Office, the disclosure of which is hereby incorporated by reference in its entirety.

BACKGROUND

Some example embodiments of inventive concepts relate to a semiconductor device and a method of operating the same and, more particularly, to a semiconductor memory device including a capacitor and/or a method of operating the same.

Semiconductor devices may be categorized as any one of memory devices and logic devices. The memory devices may store logical data. Typically, semiconductor memory devices may be classified into volatile memory devices and non-volatile memory devices. The volatile memory devices may lose their stored data when their power supplies are interrupted. For example, the volatile memory devices may include at least one of dynamic random access memory (DRAM) devices and static random access memory (SRAM) devices. The non-volatile memory devices may retain their stored data even when their power supplies are interrupted. For example, the non-volatile memory devices may include at least one of programmable ROM (PROM), erasable PROM (EPROM), electrically EPROM (EEPROM), and a flash memory device.

In addition, next-generation semiconductor memory devices (e.g., magnetic random access memory (MRAM) devices and/or phase-change random access memory (PRAM) devices) have been developed to provide high-performance and/or low power consumption semiconductor memory devices. Materials of these next-generation semiconductor memory devices may have resistance values that vary according to currents and/or voltages applied thereto and may retain their resistance values even when currents and/or voltages are interrupted.

Various techniques using semiconductor devices having different properties are being studied to improve an integration density and/or performance of a semiconductor device.

SUMMARY

Some example embodiments of inventive concepts may provide a semiconductor device capable of easily increasing an integration density and a method of operating the same.

Alternatively or additionally, some example embodiments of inventive concepts may provide a semiconductor device capable of performing a multi-bit (multi-cell) operation and/or a method of operating the same.

According to some example embodiments, a semiconductor device may include a conductive pattern extending in a first direction, a magnetic tunnel junction pattern on the conductive pattern, and a capacitor on the magnetic tunnel junction pattern. The magnetic tunnel junction pattern is between the conductive pattern and the capacitor, and the magnetic tunnel junction pattern connects to the capacitor, and the conductive pattern is configured to apply spin-orbit torque to the magnetic tunnel junction pattern.

According to some example embodiments, a semiconductor device may include a capacitor on a substrate, a magnetic tunnel junction pattern between the substrate and the capacitor and connected to the capacitor, and a conductive pattern between the substrate and the magnetic tunnel junction pattern. The capacitor comprises a bottom electrode connected to the magnetic tunnel junction pattern, a top electrode covering the bottom electrode, and a dielectric layer between the bottom electrode and the top electrode. The conductive pattern has a bar shape extending in a first direction that is parallel to a top surface of the substrate.

According to some example embodiments, a semiconductor device may include a lower conductive line on a substrate and extending in a first direction that is parallel to a top surface of the substrate, a plurality of contact plugs on the lower conductive line and apart from each other in the first direction, a plurality of conductive patterns on the plurality of contact plugs, respectively, and spaced apart from each other in the first direction, a plurality of magnetic tunnel junction patterns on the plurality of conductive patterns, respectively, and a capacitor on the magnetic tunnel junction patterns. The capacitor includes a plurality of bottom electrodes apart from each other in the first direction, and the magnetic tunnel junction patterns connect to the bottom electrodes, respectively.

According to some example embodiments of inventive concepts provides a method of operating a semiconductor device including a capacitor structure and a switching element connected to the capacitor structure includes providing a first switching current to a conductive pattern adjacent to the magnetic tunnel junction pattern, the first switching current putting the magnetic tunnel junction pattern in a low resistance state, enabling performance of a first write operation for storing data in the capacitor, in response to the magnetic tunnel junction pattern being in the low resistance state, and providing a first reverse switching current to the conductive pattern to put the magnetic tunnel junction pattern in a high resistance state. The first switching current and the first reverse switching current are in-plane currents in the conductive pattern.

BRIEF DESCRIPTION OF THE DRAWINGS

Inventive concepts will become more apparent in view of the attached drawings and accompanying detailed description.

DETAILED DESCRIPTION OF SOME EXAMPLE EMBODIMENTS

Hereinafter, some example embodiments of inventive concepts will be described in detail with reference to the accompanying drawings.

Figure 1:
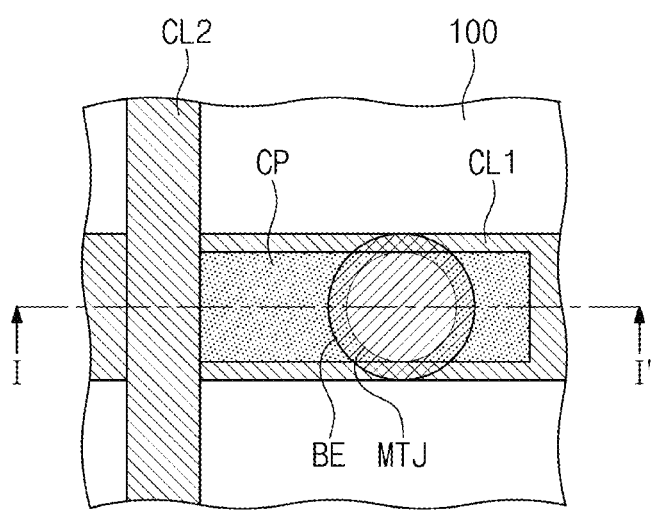
FIG. 1 is a plan view illustrating a semiconductor device according to some example embodiments of inventive concepts.
Figure 1:
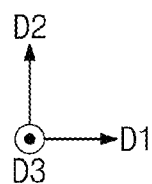
Figure 2:
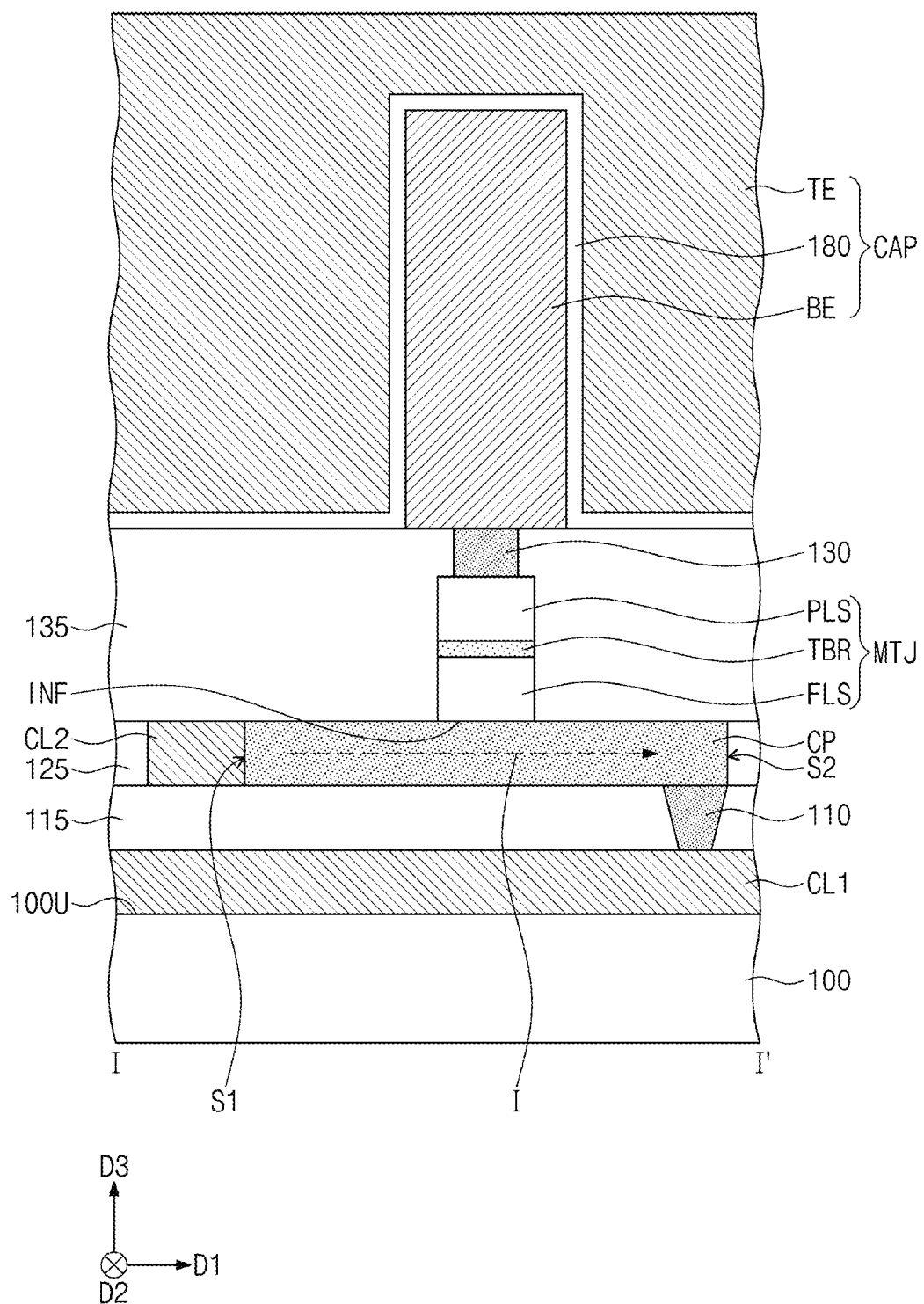
FIG. 2 is a cross-sectional view taken along a line I-I' of FIG. 1.
Figure 3A:
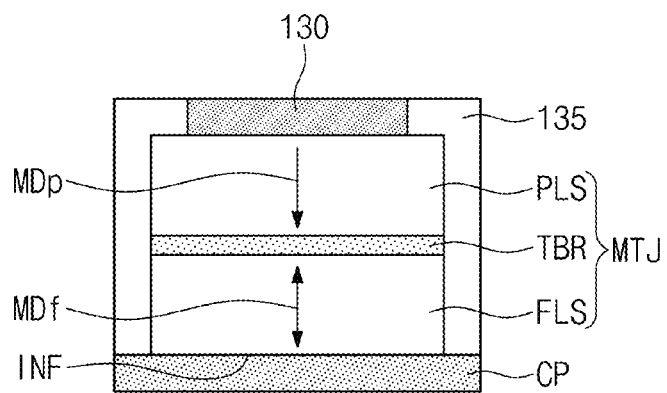
FIGS. 3A and 3B are cross-sectional views illustrating examples of a magnetic tunnel junction pattern of FIG. 2.
Figure 3B:
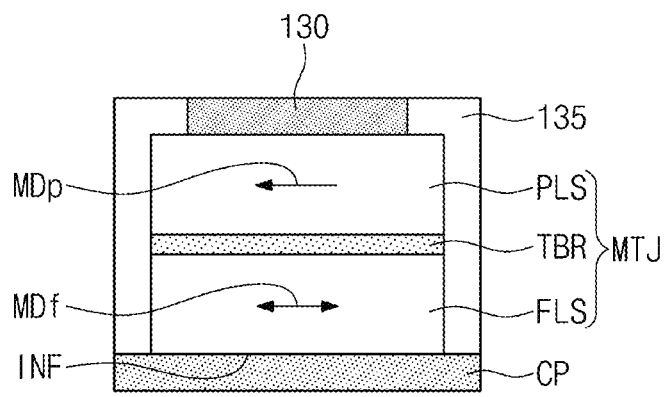

FIG. 1 is a plan view illustrating a semiconductor device according to some example embodiments of inventive concepts, and FIG. 2 is a cross-sectional view taken along a line I-I' of FIG. 1. FIGS. 3A and 3B are cross-sectional views illustrating examples of a magnetic tunnel junction pattern of FIG. 2.

Referring to FIGS. 1 and 2, a lower conductive line CL1 may be disposed on a substrate 100 and may extend long in a first direction D1 parallel to a top surface 100U of the substrate 100. The substrate 100 may include at least one of a semiconductor substrate (e.g., a silicon (Si) substrate, a germanium (Ge) substrate, or a silicon-germanium (SiGe) substrate). The lower conductive line CL1 may include a metal (e.g., at least one of titanium, tungsten, aluminum, copper, and/or tantalum) and/or a metal nitride (e.g., at least one of titanium nitride, tantalum nitride, and/or tungsten nitride).

A first interlayer insulating layer 115 may be disposed on the lower conductive line CL1 and may cover the lower conductive line CL1. A contact plug 110 may be disposed in the first interlayer insulating layer 115 and may penetrate the first interlayer insulating layer 115 so as to be connected to (e.g. directly connected to) the lower conductive line CL1. The first interlayer insulating layer 115 may expose a top surface of the contact plug 110. For example, a top surface of the first interlayer insulating layer 115 may be coplanar with the top surface of the contact plug 110. For example, the first interlayer insulating layer 115 may include at least one of silicon oxide, silicon nitride, and/or silicon oxynitride, and the contact plug 110 may include a metal (e.g., at least one of titanium, tungsten, aluminum, copper, and/or tantalum) and/or a metal nitride (e.g., at least one of titanium nitride, tantalum nitride, and/or tungsten nitride).

A conductive pattern CP may be disposed on the first interlayer insulating layer 115. The conductive pattern CP may be vertically spaced apart from the lower conductive line CL1 with the first interlayer insulating layer 115 interposed therebetween. The conductive pattern CP may cover the exposed top surface of the contact plug 110 and may be connected to (e.g. directly connected to) the contact plug 110. The contact plug 110 may electrically connect the lower conductive line CL1 and the conductive pattern CP to each other.

The conductive pattern CP may have a bar shape, e.g. a rectangular shape, extending long in the first direction D1. In some example embodiments, the conductive pattern CP may include a heavy metal or a material including, e.g. doped with a heavy metal. For some examples, the conductive pattern CP may include yttrium (Y), zirconium (Zr), niobium (Nb), molybdenum (Mo), technetium (Tc), ruthenium (Ru), rhodium (Rh), palladium (Pd), cadmium (Cd), indium (In), antimony (Sb), tellurium (Te), hafnium (Hf), tantalum (Ta, including high-resistance amorphous (β-Ta), tungsten (W), rhenium (Re), osmium (Os), iridium (Jr), platinum (Pt), gold (Au), mercury (Hg), thallium (Tl), lead (Pb), bismuth (Bi), polonium (Po), astatine (At), and/or any combination thereof. For other examples, the conductive pattern CP may include 'M' including or doped with 'N'. Here, the 'N' may include at least one of vanadium (V), chromium (Cr), manganese (Mn), iron (Fe), cobalt (Co), nickel (Ni), phosphorus (P), sulfur (S), zinc (Zn), gallium (Ga), germanium (Ge), arsenic (As), selenium (Se), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), antimony (Sb), tellurium (Te), iodine (I), lutetium (Lu), hafnium (Hf), tantalum (Ta), tungsten (W), rhenium (Re), osmium (Os), iridium (Jr), platinum (Pt), gold (Au), mercury (Hg), thallium (Tl), lead (Pb), bismuth (Bi), polonium (Po), astatine (At), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), or ytterbium (Yb), and the 'M' may include at least one of aluminum (Al), titanium (Ti), vanadium (V), chromium (Cr), manganese (Mn), copper (Cu), zinc (Zn), silver (Ag), hafnium (Hf), tantalum (Ta), tungsten (W), rhenium (Re), platinum (Pt), gold (Au), mercury (Hg), lead (Pb), silicon (Si), gallium (Ga), gallium-manganese (GaMn), or gallium-arsenic (GaAs). In some example embodiments, the conductive pattern CP may include a topological insulator. In this case, the conductive pattern CP may include a compound including at least one of tellurium (Te) or selenium (Se) (i.e., a chalcogen element) and at least one of silicon (Si), germanium (Ge), bismuth (Bi), or antimony (Sb). For example, the conductive pattern CP may include at least one of GeSe, BiSe, BiSbTe, GeTe, GeTeSe, GeSbTe, SiTe, or SiGeTe.

An upper conductive line CL2 may be disposed on the first interlayer insulating layer 115 at one side of the conductive pattern CP. The upper conductive line CL2 may be vertically spaced apart from the lower conductive line CL1 with the first interlayer insulating layer 115 interposed therebetween. The upper conductive line CL2 may be over the lower conductive line CL1 and may intersect the lower conductive line CL1. For example, the upper conductive line CL2 may extend long in a second direction D2 which is parallel to the top surface 100U of the substrate 100 and intersects the first direction D1. The upper conductive line CL2 may include a metal (e.g., at least one of titanium, tungsten, aluminum, copper, and/or tantalum) and/or a metal nitride (e.g., at least one of titanium nitride, tantalum nitride, and/or tungsten nitride).

The upper conductive line CL2 and the contact plug 110 may be respectively connected to (e.g. directly connected to) end portions of the conductive pattern CP, which are opposite to each other in the first direction D1. For example, the conductive pattern CP may have a first sidewall S1 and a second sidewall S2 which are opposite to each other in the first direction D1, and the upper conductive line CL2 and the contact plug 110 may be disposed adjacent to/directly adjacent to the first sidewall S1 and the second sidewall S2, respectively. The upper conductive line CL2 may be connected to (or in contact or direct contact with) the first sidewall S1 of the conductive pattern CP, and the contact plug 110 may be connected to (or in contact or direct contact with) a bottom surface of the conductive pattern CP, which is close to the second sidewall S2 of the conductive pattern CP.

A second interlayer insulating layer 125 may be disposed on the first interlayer insulating layer 115 and may cover sidewalls of the upper conductive line CL2 and the conductive pattern CP. The second interlayer insulating layer 125 may expose, e.g. may not cover, top surfaces of the upper conductive line CL2 and the conductive pattern CP. For example, the second interlayer insulating layer 125 may include at least one of silicon oxide, silicon nitride, and/or silicon oxynitride.

A magnetic tunnel junction pattern MTJ may be disposed on the conductive pattern CP. The conductive pattern CP may extend in the first direction D1 under the magnetic tunnel junction pattern MTJ. The contact plug 110 may be offset from the magnetic tunnel junction pattern MTJ in the first direction D1, and the upper conductive line CL2 may be offset from the magnetic tunnel junction pattern MTJ in a direction opposite to the first direction D1.

The magnetic tunnel junction pattern MTJ may include a free magnetic pattern FLS, a tunnel barrier pattern TBR and a pinned, or reference magnetic pattern PLS, which are sequentially stacked in a third direction D3 perpendicular to the top surface 100U of the substrate 100. The free magnetic pattern FLS may be on, e.g. directly on, the conductive pattern CP, the tunnel barrier pattern TBD may be on or directly on the free magnetic pattern FLS, and the reference magnetic pattern PLS may be on or directly on the tunnel barrier pattern TBD; however, example embodiments are not limited thereto. The tunnel barrier pattern TBR may be disposed between the reference magnetic pattern PLS and the free magnetic pattern FLS. For example, the tunnel barrier pattern TBR may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the reference magnetic pattern PLS and the free magnetic pattern FLS may include at least one magnetic layer.

In some example embodiments, the free magnetic pattern FLS may be disposed between the tunnel barrier pattern TBR and the conductive pattern CP, and the reference magnetic pattern PLS may be spaced apart from the free magnetic pattern FLS with the tunnel barrier pattern TBR interposed therebetween. In some embodiments, unlike FIG. 2, the reference magnetic pattern PLS may be disposed between the tunnel barrier pattern TBR and the conductive pattern CP, and the free magnetic pattern FLS may be spaced apart from the reference magnetic pattern PLS with the tunnel barrier pattern TBR interposed therebetween.

Referring to FIGS. 2, 3A and 3B, the reference magnetic pattern PLS may include a reference layer having a magnetization direction MDp fixed, e.g. pointing, in one direction, and the free magnetic pattern FLS may include a free layer having a magnetization direction MDf which may be changed to be parallel or to be anti-parallel to the magnetization direction MDp of the reference magnetic pattern PLS.

In some example embodiments, as illustrated in FIG. 3A, the magnetization directions MDp and MDf of the reference magnetic pattern PLS and the free magnetic pattern FLS may be substantially perpendicular to an interface between the tunnel barrier pattern TBR and the free magnetic pattern FLS. For example, the magnetization directions MDp and MDf of the reference magnetic pattern PLS and the free magnetic pattern FLS may be substantially perpendicular to an interface INF between the magnetic tunnel junction pattern MTJ and the conductive pattern CP. In some example embodiments, each of the reference magnetic pattern PLS and the free magnetic pattern FLS may include at least one of an intrinsic perpendicular magnetic material or an extrinsic perpendicular magnetic material. The intrinsic perpendicular magnetic material may include a material which has a perpendicular magnetization property even though an external factor such as an external electromagnetic field does not exist. The intrinsic perpendicular magnetic material may include at least one of a perpendicular magnetic material (e.g., at least one of CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where 'n' denotes the number of bilayers. A thickness of each of the magnetic layers may be the same, or may be different. A thickness of each of the non-magnetic layers may be the same, or may be different, and may be the same as or different from the thickness of each of the magnetic layers. The extrinsic perpendicular magnetic material may include a material which has an intrinsic horizontal magnetization property but has a perpendicular magnetization property by or in the presence of an external factor. For example, the extrinsic perpendicular magnetic material may have the perpendicular magnetization property by magnetic anisotropy induced by a junction of the tunnel barrier pattern TBR and the reference magnetic pattern PLS (and/or the free magnetic pattern FLS). The extrinsic perpendicular magnetic material may include, for example, CoFeB. Each of the reference magnetic pattern PLS and the free magnetic pattern FLS may include a Co-based Heusler alloy.

In some example embodiments, as illustrated in FIG. 3B, the magnetization directions MDp and MDf of the reference magnetic pattern PLS and the free magnetic pattern FLS may be parallel or substantially parallel to the interface between the tunnel barrier pattern TBR and the free magnetic pattern FLS. For example, the magnetization directions MDp and MDf of the reference magnetic pattern PLS and the free magnetic pattern FLS may be substantially parallel to the interface INF between the magnetic tunnel junction pattern MTJ and the conductive pattern CP. In some example embodiments, each of the reference magnetic pattern PLS and the free magnetic pattern FLS may include a ferromagnetic material, and the reference magnetic pattern PLS may further include an antiferromagnetic material that fixes a magnetization direction of the ferromagnetic material.

The conductive pattern CP may be configured to apply spin-orbit torque to the magnetic tunnel junction pattern MTJ. For example, referring to FIG. 2 an in-plane current I flowing in the conductive pattern CP may flow in parallel to the interface INF between the conductive pattern CP and the magnetic tunnel junction pattern MTJ. In some example embodiments, a spin current based on a spin Hall effect (e.g., a quantum spin Hall effect) may flow in a direction perpendicular or substantially perpendicular to the interface INF, and thus the spin-orbit torque may be applied to the magnetic tunnel junction pattern MTJ. The magnetization direction MDf of the free magnetic pattern FLS may be switched by the spin-orbit torque.

Referring again to FIGS. 1 and 2, a conductive pad 130 may be disposed on the magnetic tunnel junction pattern MTJ. The magnetic tunnel junction pattern MTJ may be disposed between the conductive pattern CP and the conductive pad 130. The conductive pad 130 may include at least one of a doped semiconductor material (e.g., doped poly-crystalline silicon doped with impurities such as boron and/or phosphorus), a metal-semiconductor compound (e.g., tungsten silicide), a conductive metal nitride (e.g., at least one of titanium nitride, tantalum nitride, or tungsten nitride), or a metal (e.g., at least one of titanium, tungsten, or tantalum).

A third interlayer insulating layer 135 may be disposed on the second interlayer insulating layer 125 and may cover the exposed top surfaces of the upper conductive line CL2 and the conductive pattern CP. The third interlayer insulating layer 135 may cover the magnetic tunnel junction pattern MTJ and the conductive pad 130 and may expose (e.g. may not cover) a top surface of the conductive pad 130. For example, the third interlayer insulating layer 135 may include at least one of silicon oxide, silicon nitride, and/or silicon oxynitride.

A capacitor structure CAP may be disposed on the third interlayer insulating layer 135. The capacitor structure CAP may include a bottom electrode BE on the conductive pad 130, a top electrode TE covering the bottom electrode BE, and a dielectric layer 180 between the bottom electrode BE and the top electrode TE. The bottom electrode BE may be electrically connected to the magnetic tunnel junction pattern MTJ through the conductive pad 130. The bottom electrode BE may have a pillar shape extending in the third direction D3. However, example embodiments of inventive concepts are not limited thereto. The bottom electrode BE may be separated from the top electrode TE by the dielectric layer 180. The dielectric layer 180 may be disposed between the bottom electrode BE and the top electrode TE and may extend between the top electrode TE and the third interlayer insulating layer 135.

The bottom electrode BE and the top electrode TE may include at least one of doped poly-silicon, a metal, a metal silicide, or a metal nitride, and may or may not include or consist of the same material as each other. The dielectric layer 180 may include at least one of an oxide (e.g., silicon oxide), a nitride (e.g., silicon nitride), an oxynitride (e.g., silicon oxynitride), or a high-k dielectric material (e.g., hafnium oxide).

According to some example embodiments of inventive concepts, the conductive pattern CP and the magnetic tunnel junction pattern MTJ may function as a switching element, e.g. a non-transistor based switching element, based on the spin-orbit torque. For example, the magnetization direction MDf of the free magnetic pattern FLS may be switched to be parallel or anti-parallel to the magnetization direction MDp of the reference magnetic pattern PLS, by the spin-orbit torque generated by the in-plane current I flowing in the conductive pattern CP. When the magnetization direction MDf of the free magnetic pattern FLS is parallel to the magnetization direction MDp of the reference magnetic pattern PLS, the magnetic tunnel junction pattern MTJ may be in a low-resistance state, and the low-resistance state of the magnetic tunnel junction pattern MTJ may be defined as an on-state of the switching element. When the magnetization direction MDf of the free magnetic pattern FLS is anti-parallel to the magnetization direction MDp of the reference magnetic pattern PLS, the magnetic tunnel junction pattern MTJ may be in a high-resistance state, and the high-resistance state of the magnetic tunnel junction pattern MTJ may be defined as an off-state of the switching element. For example, the on/off state of the switching element may be determined depending on the resistance state of the magnetic tunnel junction pattern MTJ, and the amount of charges, e.g. the amount of electrons, charged into or discharged from the capacitor structure CAP may be controlled by the on/off state of the switching element. Data "1" or "0" may be determined depending on the amount of charges stored in the capacitor structure CAP.

According to inventive concepts, a unit memory cell of a semiconductor device may include the spin-orbit torque-based switching element including the conductive pattern CP and the magnetic tunnel junction pattern MTJ, and the capacitor structure CAP controlled by the spin-orbit torque-based switching element. The unit memory cell of a semiconductor device may not include a transistor, such as an NMOS transistor.

Figure 4:
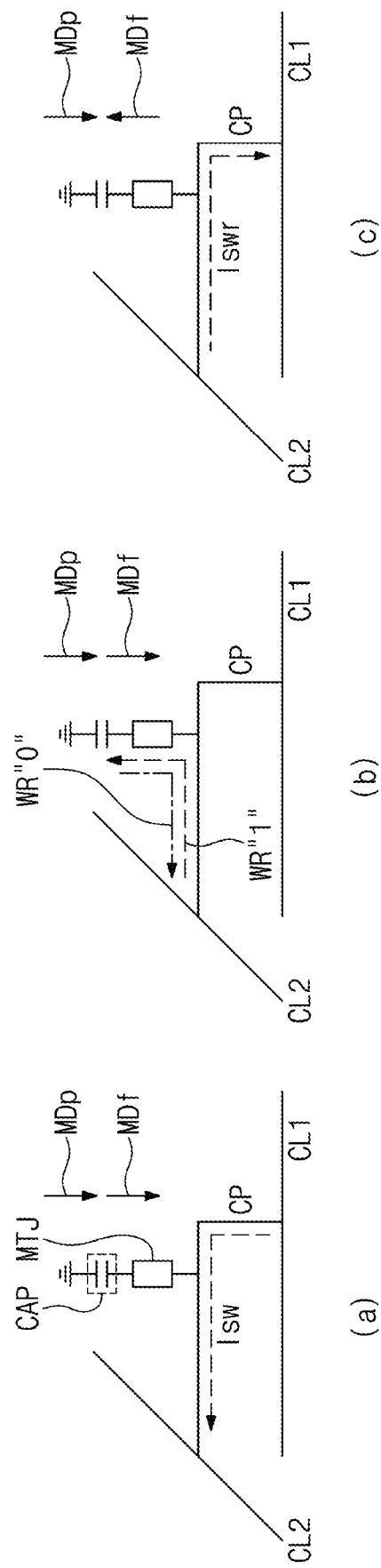
FIG. 4 is a conceptual diagram illustrating an example of a write operation of the semiconductor device of FIG. 2.

FIG. 4 is a conceptual diagram illustrating an example of a write operation of the semiconductor device of FIG. 2.

Referring to FIGS. 2 and 4, a switching voltage (Vsw) may be applied to the conductive pattern CP through the lower conductive line CL1 and the upper conductive line CL2. Thus, a switching current Isw may flow in the conductive pattern CP (see (a) of FIG. 4). The switching current Isw may be an in-plane current flowing through the conductive pattern CP and may flow in parallel to the interface INF between the conductive pattern CP and the magnetic tunnel junction pattern MTJ. Accordingly, a spin current based on a spin Hall effect (e.g., a quantum spin Hall effect) may flow in a direction substantially perpendicular to the interface INF, and thus the spin-orbit torque may be applied to the magnetic tunnel junction pattern MTJ. The magnetization direction MDf of the free magnetic pattern FLS may be switched in parallel to the magnetization direction MDp of the reference magnetic pattern PLS by the spin-orbit torque generated by the switching current Isw. Accordingly, the magnetic tunnel junction pattern MTJ may be in a low-resistance state (e.g., a switch on-state).

When a first write voltage (Vwr1) is applied to the upper conductive line CL2, charges may be charged into the capacitor structure CAP through the conductive pattern CP and the magnetic tunnel junction pattern MTJ, and thus data "1" may be written to/stored in the capacitor structure CAP (see WR "1" of (b) of FIG. 4). For example, the first write voltage (Vwr1) may be a power voltage (VDD), and the capacitor structure CAP may be connected to a ground voltage ($V_{GND}$). Accordingly, a first voltage (V1) may be applied to the lower conductive line CL1, and the first voltage (V1) may be greater than the ground voltage ($V_{GND}$) and may be less than the first write voltage (Vwr1).

When a second write voltage (Vwr0) is applied to the upper conductive line CL2, charges in the capacitor structure CAP may be discharged through the conductive pattern CP and the magnetic tunnel junction pattern MTJ, and thus data "0" may be stored in the capacitor structure CAP (see WR "0" of (b) of FIG. 4). The second write voltage (Vwr0) may be less than the ground voltage ($V_{GND}$). For example, the second write voltage (Vwr0) may be 0. Accordingly, a second voltage (V0) may be applied to the lower conductive line CL1, and the second voltage (V0) may be equal to or less than the ground voltage ($V_{GND}$). Example embodiments are not limited to a two-state storage device; for example, more than one bit may be stored within the capacitor structure CAP. Furthermore, a logic level of the bit stored within the capacitor structure CAP may be "1" when charge is stored and "0" when charge is dissipated, or may be "0" when charge is stored and "1" when charge is dissipated; example embodiments are not limited thereto.

After data (1 or 0) is stored in the capacitor structure CAP, a reverse switching voltage (Vswr) may be applied to the conductive pattern CP through the lower conductive line CL1 and the upper conductive line CL2. Thus, a reverse switching current Iswr may flow in the conductive pattern CP (see (c) of FIG. 4). The reverse switching current Iswr may flow in a direction opposite to a flowing direction of the switching current Isw. The reverse switching current Iswr may be an in-plane current flowing through the conductive pattern CP and may flow in parallel to the interface INF between the conductive pattern CP and the magnetic tunnel junction pattern MTJ Accordingly, a spin current based on a spin Hall effect (e.g., a quantum spin Hall effect) may flow in a direction substantially perpendicular to the interface INF, and thus the spin-orbit torque may be applied to the magnetic tunnel junction pattern MTJ. A direction of the spin-orbit torque generated by the reverse switching current Iswr may be opposite to a direction of the spin-orbit torque generated by the switching current Isw. The magnetization direction MDf of the free magnetic pattern FLS may be switched in anti-parallel to the magnetization direction MDp of the reference magnetic pattern PLS by the spin-orbit torque generated by the reverse switching current Iswr. Accordingly, the magnetic tunnel junction pattern MTJ may be in a high-resistance state (i.e., a switch off-state).

Figure 5:
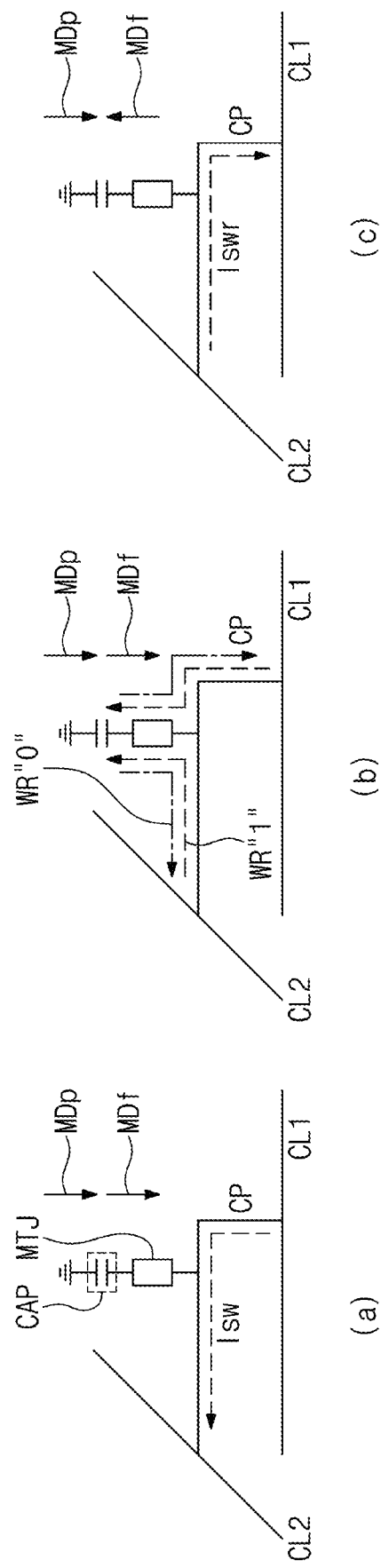
FIG. 5 is a conceptual diagram illustrating an example of a write operation of the semiconductor device of FIG. 2.

FIG. 5 is a conceptual diagram illustrating an example of a write operation of the semiconductor device of FIG. 2.

Referring to FIGS. 2 and 5, the switching voltage (Vsw) may be applied to the conductive pattern CP through the lower conductive line CL1 and the upper conductive line CL2. Thus, the switching current Isw may flow in the conductive pattern CP (see (a) of FIG. 5). The magnetization direction MDf of the free magnetic pattern FLS may be switched in parallel to the magnetization direction MDp of the reference magnetic pattern PLS by the spin-orbit torque generated by the switching current Isw. Accordingly, the magnetic tunnel junction pattern MTJ may be in the low-resistance state (e.g., the switch on-state).

When the first write voltage (Vwr1) is applied to each of the upper conductive line CL2 and the lower conductive line CL1, charges may be charged into the capacitor structure CAP through the conductive pattern CP and the magnetic tunnel junction pattern MTJ, and thus data "1" may be stored in the capacitor structure CAP (see WR "1" of (b) of FIG. 5). For example, the first write voltage (Vwr1) may be the power voltage (VDD), and the capacitor structure CAP may be connected to the ground voltage ($V_{GND}$). According to the present write operation, unlike that described with reference to FIG. 4, the first write voltage (Vwr1) may be applied to both the upper conductive line CL2 and the lower conductive line CL1, and thus a charging speed of the charges into the capacitor structure CAP may be relatively high.

When the second write voltage (Vwr0) is applied to each of the upper conductive line CL2 and the lower conductive line CL1, charges in the capacitor structure CAP may be discharged through the conductive pattern CP and the magnetic tunnel junction pattern MTJ, and thus data "0" may be stored in the capacitor structure CAP (see WR "0" of (b) of FIG. 5). The second write voltage (Vwr0) may be less than the ground voltage ($V_{GND}$). For example, the second write voltage (Vwr0) may be 0. According to the present write operation, the second write voltage (Vwr0) may be applied to both the upper conductive line CL2 and the lower conductive line CL1, and thus a discharging speed of the charges from the capacitor structure CAP may be relatively high.

After data (1 or 0) is stored in the capacitor structure CAP, the reverse switching voltage (Vswr) may be applied to the conductive pattern CP through the lower conductive line CL1 and the upper conductive line CL2. Thus, the reverse switching current Iswr may flow in the conductive pattern CP (see (c) of FIG. 5). The magnetization direction MDf of the free magnetic pattern FLS may be switched in anti-parallel to the magnetization direction MDp of the reference magnetic pattern PLS by the spin-orbit torque generated by the reverse switching current Iswr. Accordingly the magnetic tunnel junction pattern MTJ may be in the high-resistance state (i.e., the switch off-state).

Figure 6:
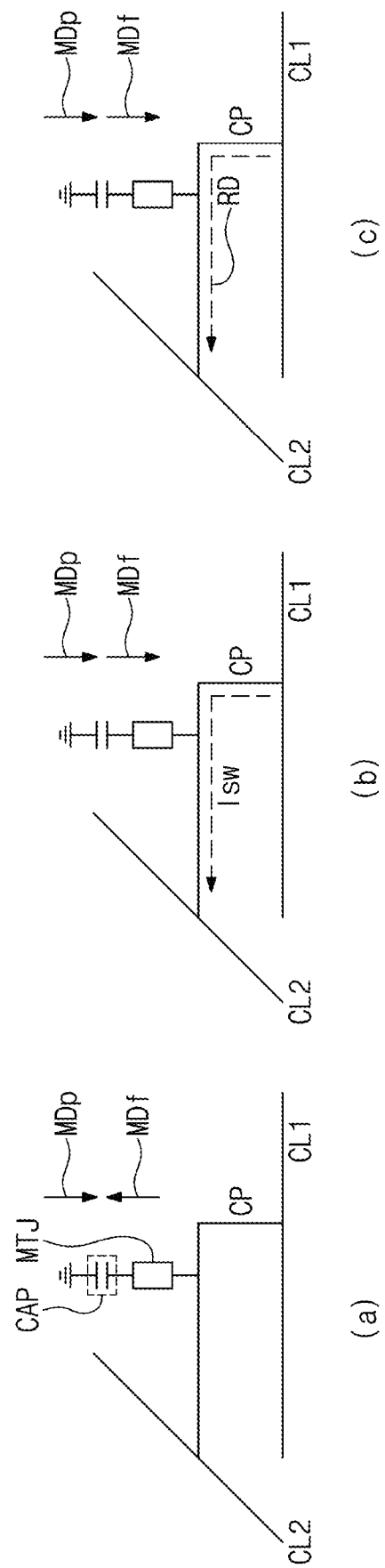
FIG. 6 is a conceptual diagram illustrating a read operation of the semiconductor device of FIG. 2.

FIG. 6 is a conceptual diagram illustrating a read operation of the semiconductor device of FIG. 2.

Referring to FIGS. 2 and 6, for example, the magnetization direction MDf of the free magnetic pattern FLS may be anti-parallel to the magnetization direction MDp of the reference magnetic pattern PLS. For example, the magnetic tunnel junction pattern MTJ may be in the high-resistance state (e.g., the switch off-state) (see (a) of FIG. 6).

The switching voltage (Vsw) may be applied to the conductive pattern CP through the lower conductive line CL1 and the upper conductive line CL2. Thus, the switching current Isw may flow in the conductive pattern CP (see (b) of FIG. 6). The magnetization direction MDf of the free magnetic pattern FLS may be switched in parallel to the magnetization direction MDp of the reference magnetic pattern PLS by the spin-orbit torque generated by the switching current Isw. Thus, the state of the magnetic tunnel junction pattern MTJ may be changed into the low-resistance state (e.g., the switch on-state).

A read voltage (Vrd) may be applied to the conductive pattern CP through the lower conductive line CL1 and the upper conductive line CL2, and thus a read current RD may flow in the conductive pattern CP (see (c) of FIG. 6). The read current RD may be or correspond to an in-plane current flowing through the conductive pattern CP. For example, the read voltage (Vrd) may be VDD/2. When data of the capacitor structure CAP is "1", charges in the capacitor structure CAP may move into the conductive pattern CP, and thus the read voltage (Vrd) may be increased (e.g., $\Delta Vrd>0$). When data of the capacitor structure CAP is "0", charges in the conductive pattern CP may move into the capacitor structure CAP, and thus the read voltage (Vrd) may be reduced (e.g., $\Delta Vrd<0$). The data of the capacitor structure CAP may be detected depending on the increase and/or reduction of the read voltage (Vrd).

Figure 7:
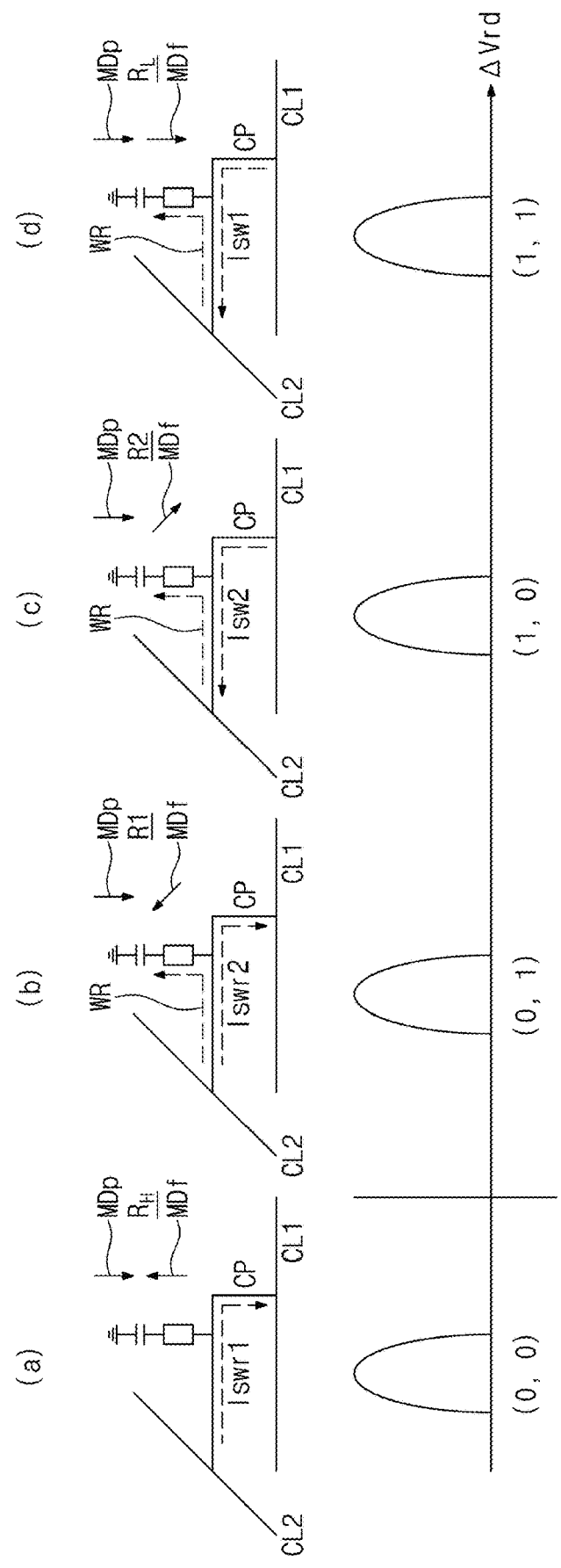
FIG. 7 is a conceptual diagram illustrating a multi-bit operation of the semiconductor device of FIG. 2.

FIG. 7 is a conceptual diagram illustrating a multi-bit operation of the semiconductor device of FIG. 2.

Referring to FIGS. 2 and 7, after data "0" is stored in the capacitor structure CAP, a first reverse switching voltage (Vswr1) may be applied to the conductive pattern CP through the lower conductive line CL1 and the upper conductive line CL2. Thus, a first reverse switching current Iswr1 may flow in the conductive pattern CP (see (a) of FIG. 7). The first reverse switching current Iswr1 may be or correspond to an in-plane current flowing through the conductive pattern CP and may flow in parallel to the interface INF between the conductive pattern CP and the magnetic tunnel junction pattern MTJ. The magnetization direction MDf of the free magnetic pattern FLS may be switched in anti-parallel to the magnetization direction MDp of the reference magnetic pattern PLS by spin-orbit torque generated by the first reverse switching current Iswr1. Accordingly, the magnetic tunnel junction pattern MTJ may be in a high-resistance state $R_H$ (e.g., a switch off-state). When the data of the capacitor structure CAP is "0", the read voltage (Vrd) by the read operation of FIG. 6 may be reduced (i.e., ΔVrd<0). Accordingly, the data of the capacitor structure CAP may be defined as (0, 0); however, example embodiments are not limited thereto, and the data of the capacitor structure CAP may be one of (0, 1), (1, 1), or (1, 0).

A first switching voltage (Vsw1) may be applied to the conductive pattern CP through the lower conductive line CL1 and the upper conductive line CL2. Thus, a first switching current Isw1 may flow in the conductive pattern CP (see (d) of FIG. 7). The first switching current Isw1 may be an in-plane current flowing through the conductive pattern CP and may flow in parallel to the interface INF between the conductive pattern CP and the magnetic tunnel junction pattern MTJ. The first switching current Isw1 may flow in a direction opposite to a flowing direction of the first reverse switching current Iswr1. A direction of spin-orbit torque generated by the first switching current Isw1 may be opposite to a direction of the spin-orbit torque generated by the first reverse switching current Iswr1. Thus, the magnetization direction MDf of the free magnetic pattern FLS may be switched in parallel to the magnetization direction MDp of the reference magnetic pattern PLS by the spin-orbit torque generated by the first switching current Isw1. Accordingly, the magnetic tunnel junction pattern MTJ may be in a low-resistance state $R_L$ (e.g., a switch on-state).

The write operation described with reference to FIGS. 4 and 5 may be performed under a condition that the magnetic tunnel junction pattern MTJ is in the low-resistance state $R_L$ (i.e., the switch on-state). For example, the first write voltage (Vwr1) may be applied to at least one of the upper conductive line CL2 or the lower conductive line CL1, and thus charges may be charged into the capacitor structure CAP through the conductive pattern CP and the magnetic tunnel junction pattern MTJ (see WR of (d) of FIG. 7). Data "1" may be stored in the capacitor structure CAP, and the read voltage (Vrd) by the read operation of FIG. 6 may be increased (i.e., ΔVrd>>>0). Accordingly, the data of the capacitor structure CAP may be defined as (1, 1); however, example embodiments are not limited thereto, and the data of the capacitor structure CAP may be one of (0, 0), (1, 0), or (0, 1).

A second reverse switching voltage (Vswr2) may be applied to the conductive pattern CP through the lower conductive line CL1 and the upper conductive line CL2. Thus, a second reverse switching current Iswr2 may flow in the conductive pattern CP (see (b) of FIG. 7). The second reverse switching current Iswr2 may be an in-plane current flowing through the conductive pattern CP and may flow in parallel to the interface INF between the conductive pattern CP and the magnetic tunnel junction pattern MTJ. The second reverse switching voltage (Vswr2) may be less than the first reverse switching voltage (Vswr1), and the second reverse switching current Iswr2 may flow in the same direction as the first reverse switching current Iswr1. A direction of spin-orbit torque generated by the second reverse switching current Iswr2 may be the same as the direction of the spin-orbit torque generated by the first reverse switching current Iswr1, and a magnitude of the spin-orbit torque generated by the second reverse switching current Iswr2 may be less than a magnitude of the spin-orbit torque generated by the first reverse switching current Iswr1. Thus, the magnetization direction MDf of the free magnetic pattern FLS may be switched in non-parallel (e.g., close to anti-parallel) to the magnetization direction MDp of the reference magnetic pattern PLS by the spin-orbit torque generated by the second reverse switching current Iswr2. Accordingly, the magnetic tunnel junction pattern MTJ may have a first resistance R1 which is less than the high resistance $R_H$ and greater than the low resistance $R_L$.

The write operation described with reference to FIGS. 4 and 5 may be performed or enabled under a condition that the magnetic tunnel junction pattern MTJ has the first resistance R1. For example, the first write voltage (Vwr1) may be applied to at least one of the upper conductive line CL2 or the lower conductive line CL1, and thus charges may be charged into the capacitor structure CAP through the conductive pattern CP and the magnetic tunnel junction pattern MTJ (see WR of (b) of FIG. 7). Accordingly, since the magnetic tunnel junction pattern MTJ has the first resistance R1 greater than the low resistance $R_L$, the amount of the charges charged in the capacitor structure CAP may be relatively small. The read voltage (Vrd) by the read operation of FIG. 6 may be increased in proportion to the amount of the charges in the capacitor structure CAP (i.e., ΔVrd>0). Accordingly, the data of the capacitor structure CAP may be defined as (0, 1), however, example embodiments are not limited thereto, and the data of the capacitor structure CAP may be one of (0, 0), (1, 1), or (0, 1).

A second switching voltage (Vsw2) may be applied to the conductive pattern CP through the lower conductive line CL1 and the upper conductive line CL2. Thus, a second switching current Isw2 may flow in the conductive pattern CP (see (c) of FIG. 7). The second switching current Isw2 may be an in-plane current flowing through the conductive pattern CP and may flow in parallel to the interface INF between the conductive pattern CP and the magnetic tunnel junction pattern MTJ. The second switching voltage (Vsw2) may be less than the first switching voltage (Vsw1), and the second switching current Isw2 may flow in the same direction as the first switching current Isw1. A direction of spin-orbit torque generated by the second switching current Isw2 may be the same as the direction of the spin-orbit torque generated by the first switching current Isw1, and a magnitude of the spin-orbit torque generated by the second switching current Isw2 may be less than a magnitude of the spin-orbit torque generated by the first switching current Isw1. Thus, the magnetization direction MDf of the free magnetic pattern FLS may be switched in non-parallel (e.g., close to parallel) to the magnetization direction MDp of the reference magnetic pattern PLS by the spin-orbit torque generated by the second switching current Isw2. Accordingly, the magnetic tunnel junction pattern MTJ may have a second resistance R2 which is greater than the low resistance $R_L$ and less than the first resistance R1.

The write operation described with reference to FIGS. 4 and 5 may be performed or be enabled under a condition that the magnetic tunnel junction pattern MTJ has the second resistance R2. For example, the first write voltage (Vwr1) may be applied to at least one of the upper conductive line CL2 or the lower conductive line CL1, and thus charges may be charged into the capacitor structure CAP through the conductive pattern CP and the magnetic tunnel junction pattern MTJ (see WR of (c) of FIG. 7). Accordingly, since the magnetic tunnel junction pattern MTJ has the second resistance R2 less than the first resistance R1, the amount of the charges charged in the capacitor structure CAP may be relatively great. The read voltage (Vrd) by the read operation of FIG. 6 may be increased in proportion to the amount of the charges in the capacitor structure CAP (e.g., ΔVrd>>0). Accordingly, the data of the capacitor structure CAP may be defined as (1, 0); however, example embodiments are not limited thereto, and the data of the capacitor structure CAP may be one of (0, 0), (1, 1), or (0, 1).

According to inventive concepts, the amount of charges (e.g. electrons) charged in the capacitor structure CAP may be controlled depending on the resistance state of the magnetic tunnel junction pattern MTJ included in the spin-orbit torque-based switching element. Thus, a semiconductor device including a unit memory cell capable of performing the multi-bit operation may be provided. Furthermore, a unit memory cell capable of performing the multi-bit operation may not include a transistor. A unit memory cell may include or consist of one magnetic tunnel junction device and one capacitor, e.g. may include or consist of a 1MTJ-1C or 1C-1MTJ unit cell.

Figure 8:
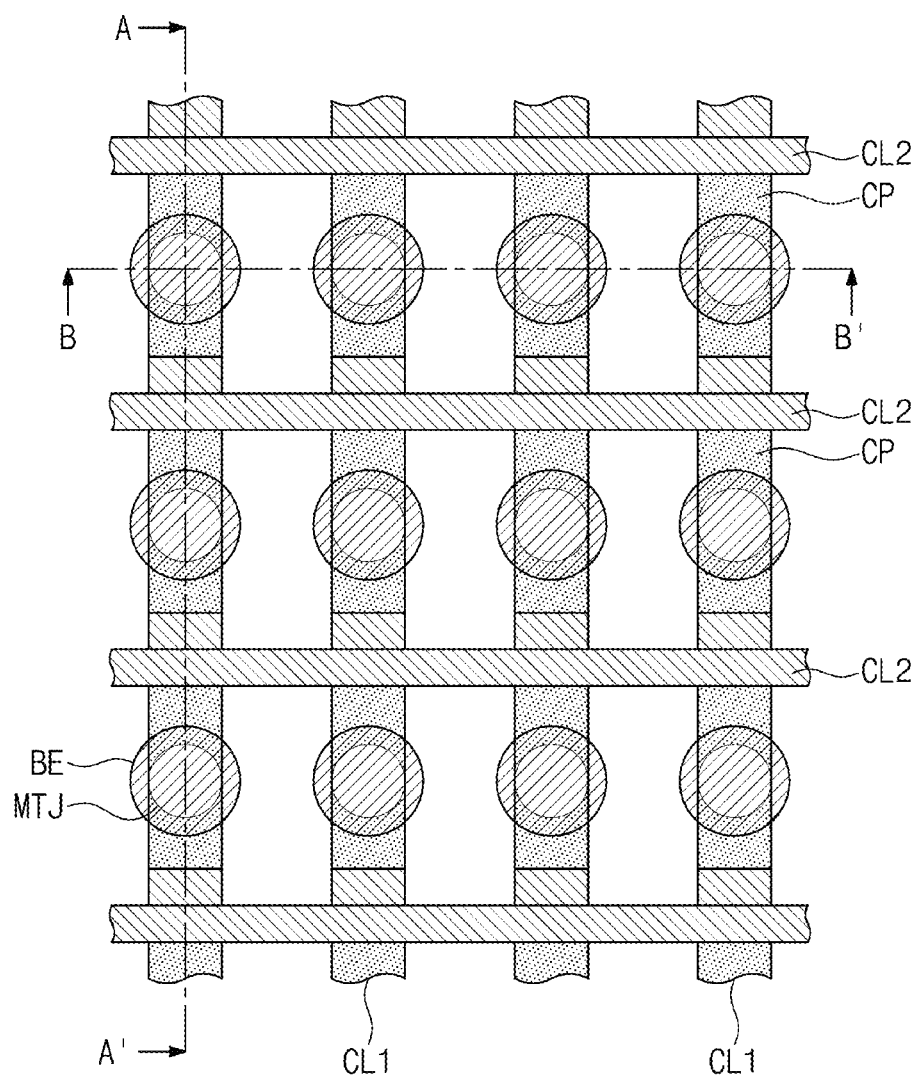
FIG. 8 is a plan view illustrating a semiconductor device according to some example embodiments of inventive concepts.
Figure 8:
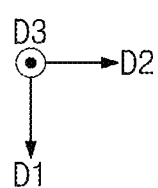
Figure 9A:
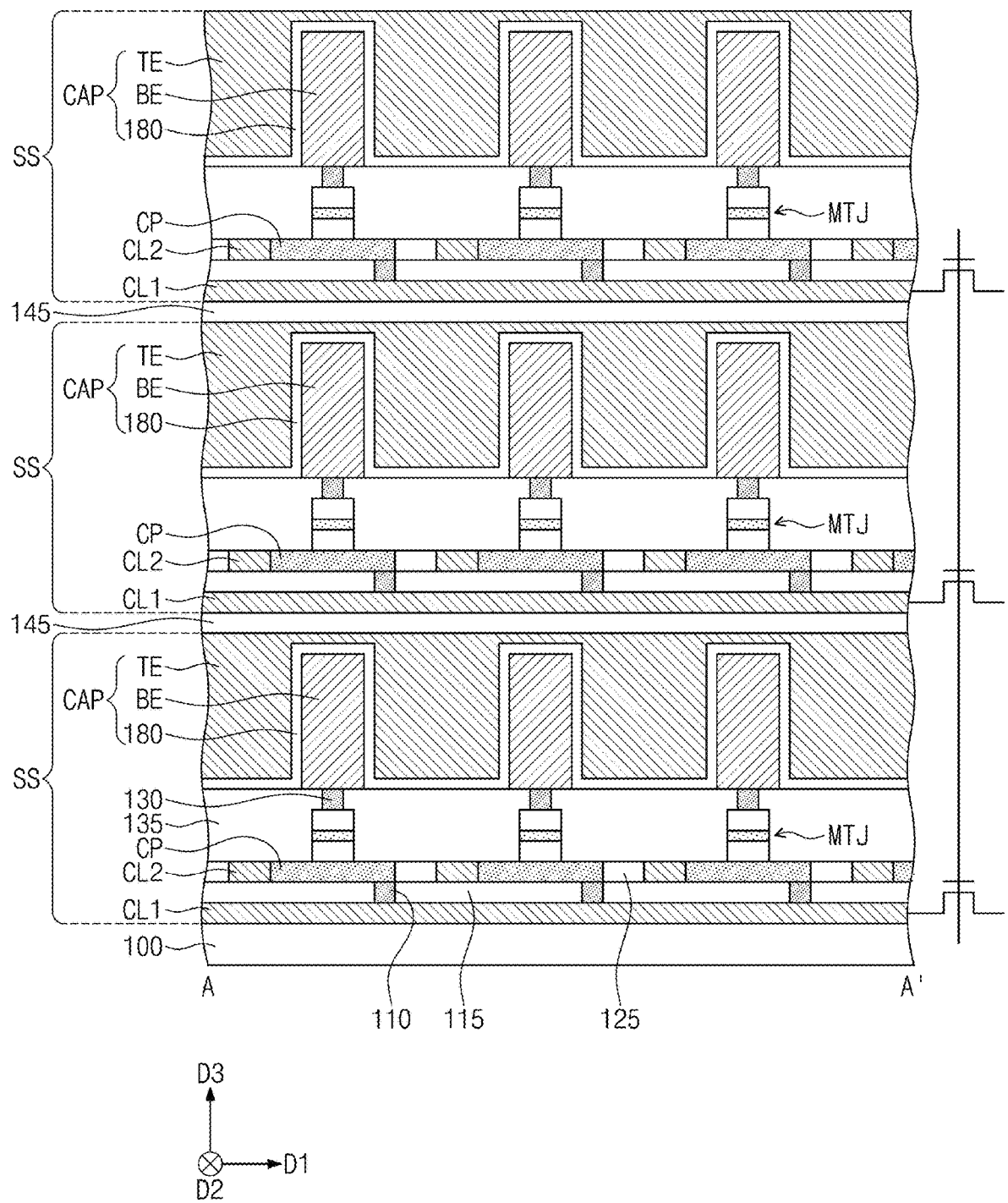
FIGS. 9A and 9B are cross-sectional views taken along lines A-A' and B-B' of FIG. 8, respectively.
Figure 9B:
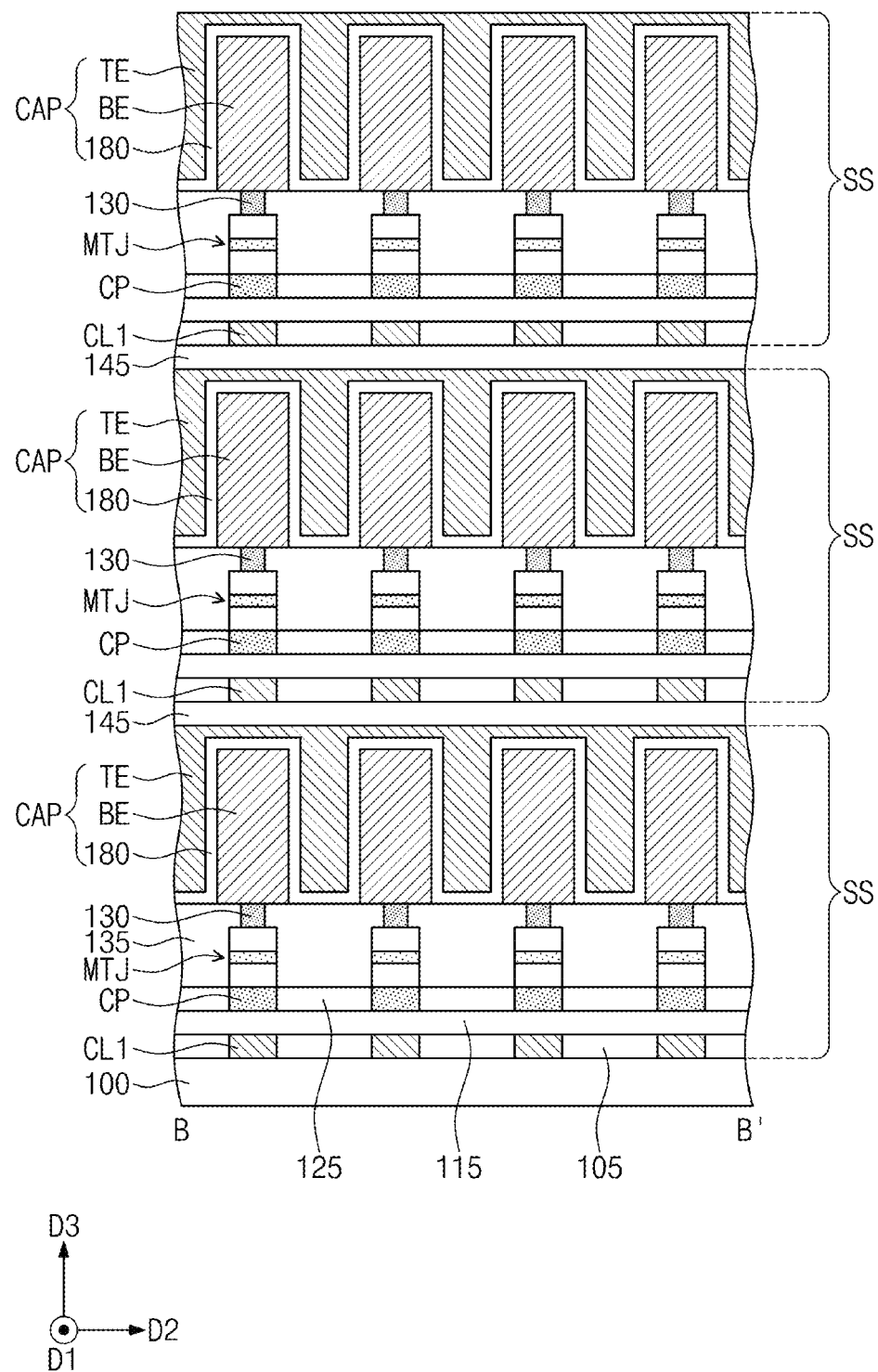

FIG. 8 is a plan view illustrating a semiconductor device according to some example embodiments of inventive concepts, and FIGS. 9A and 9B are cross-sectional views taken along lines A-A' and B-B' of FIG. 8, respectively. Hereinafter, differences between example embodiments and example embodiments described with reference to FIGS. 1 to 7 will be mainly described for the purpose of ease and convenience in explanation.

Referring to FIGS. 8, 9A and 9B, lower conductive lines CL1 may be disposed on a substrate 100. The lower conductive lines CL1 may extend long in the first direction D1 and may be spaced apart from each other in the second direction D2. Each of the lower conductive lines CL1 may be connected to at least one transistor (not illustrated) for driving each of the lower conductive lines CL1. A lower insulating layer 105 may be disposed between the lower conductive lines CL1 and may insulate the lower conductive lines CL1 from each other. For example, the lower insulating layer 105 may include at least one of silicon oxide, silicon nitride, and/or silicon oxynitride.

A first interlayer insulating layer 115 may be disposed on the lower conductive lines CL1 and may cover the lower conductive lines CL1 and the lower insulating layer 105. A plurality of contact plugs 110 may be disposed in the first interlayer insulating layer 115 and may be spaced apart from each other in the first direction D1 and the second direction D2. The plurality of contact plugs 110 may be two-dimensionally arranged, e.g. may be arranged in a repeating pattern such as a repeating rectangular or square pattern or a repeating hexagonal pattern, in the first direction D1 and the second direction D2. The contact plugs 110 arranged in the first direction D1 may penetrate the first interlayer insulating layer 115 so as to be connected to a corresponding one of the lower conductive lines CL1. The contact plugs 110 arranged in the second direction D2 may penetrate the first interlayer insulating layer 115 so as to be connected to the lower conductive lines CL1, respectively. The first interlayer insulating layer 115 may expose (e.g. may not cover) top surfaces of the plurality of contact plugs 110.

A plurality of conductive patterns CP may be disposed on the first interlayer insulating layer 115. The plurality of conductive patterns CP may be spaced apart from each other in the first direction D1 and the second direction D2 and may be two-dimensionally arranged in the first direction D1 and the second direction D2. Each of the plurality of conductive patterns CP may have a bar shape such as a rectangular shape extending long in the first direction D1. The conductive patterns CP arranged in the first direction D1 may be connected to or directly connected to the contact plugs 110 arranged in the first direction D1, respectively. The conductive patterns CP arranged in the first direction D1 may be connected to or directly connected to a corresponding one of the lower conductive lines CL1 through the contact plugs 110 arranged in the first direction D1. The conductive patterns CP arranged in the second direction D2 may be connected to or directly connected to the contact plugs 110 arranged in the second direction D2, respectively. The conductive patterns CP arranged in the second direction D2 may be connected to the lower conductive lines CL1 through the contact plugs 110 arranged in the second direction D2, respectively.

A plurality of upper conductive lines CL2 may be disposed on the first interlayer insulating layer 115. The plurality of upper conductive lines CL2 may extend in the second direction D2 and may be spaced apart from each other in the first direction D1. Each of the plurality of upper conductive lines CL2 may be connected to or directly connected to the conductive patterns CP arranged in the second direction D2. Each of the conductive patterns CP may have end portions opposite to each other in the first direction D1. One end portion of each of the conductive patterns CP may be connected to, e.g. directly connected to, a corresponding one of the plurality of upper conductive lines CL2, and another end portion of each of the conductive patterns CP may be connected to, e.g. directly connected to, a corresponding one of the plurality of contact plugs 110.

A second interlayer insulating layer 125 may be disposed on the first interlayer insulating layer 115 and may cover sidewalls of the plurality of upper conductive lines CL2 and sidewalls of the plurality of conductive patterns CP.

A plurality of magnetic tunnel junction patterns MTJ may be disposed on the plurality of conductive patterns CP, respectively. The plurality of magnetic tunnel junction patterns MTJ may be two-dimensionally arranged in the first direction D1 and the second direction D2. Each of the plurality of magnetic tunnel junction patterns MTJ may include a free magnetic pattern FLS, a tunnel barrier pattern TBR and a reference magnetic pattern PLS, which are sequentially stacked in the third direction D3. Each of the magnetic tunnel junction patterns MTJ may be the same, e.g. substantially the same as the magnetic tunnel junction pattern MTJ described with reference to FIGS. 1, 2, 3A and 3B.

A plurality of conductive pads 130 may be disposed on the plurality of magnetic tunnel junction patterns MTJ, respectively. Each of the plurality of magnetic tunnel junction patterns MTJ may be disposed between a corresponding one of the plurality of conductive patterns CP and a corresponding one of the plurality of conductive pads 130.

A third interlayer insulating layer 135 may be disposed on the second interlayer insulating layer 125 and may cover top surfaces of the plurality of upper conductive lines CL2 and top surfaces of the plurality of conductive patterns CP. The third interlayer insulating layer 135 may cover the plurality of magnetic tunnel junction patterns MTJ and the plurality of conductive pads 130 and may expose, e.g. not cover, top surfaces of the plurality of conductive pads 130.

A capacitor structure CAP may be disposed on the third interlayer insulating layer 135. The capacitor structure CAP may include a plurality of bottom electrodes BE disposed on the plurality of conductive pads 130, respectively, a top electrode TE covering the plurality of bottom electrodes BE, and a dielectric layer 180 between the top electrode TE and the plurality of bottom electrodes BE. Each of the plurality of bottom electrodes BE may be electrically connected to a corresponding one of the plurality of magnetic tunnel junction patterns MTJ through a corresponding one of the plurality of conductive pads 130.

The lower conductive lines CL1, the lower insulating layer 105, the first interlayer insulating layer 115, the plurality of contact plugs 110, the plurality of conductive patterns CP, the plurality of upper conductive lines CL2, the second interlayer insulating layer 125, the plurality of magnetic tunnel junction patterns MTJ, the plurality of conductive pads 130, the third interlayer insulating layer 135 and the capacitor structure CAP may constitute or be included in a stack structure SS. A plurality of the stack structures SS may be stacked on the substrate 100 in the third direction D3. FIGS. 9A and 9B illustrate a case in which the number of the stack structures SS stacked on the substrate 100 is 3. However, example embodiments of inventive concepts are not limited thereto.

An upper insulating layer 145 may be disposed between the plurality of stack structures SS. The upper insulating layer 145 may be disposed between the capacitor structure CAP and additional lower conductive lines CL1 disposed on the capacitor structure CAP. For example, the upper insulating layer 145 may include at least one of silicon oxide, silicon nitride, and/or silicon oxynitride.

According to some example embodiments of inventive concepts, the stack structures SS and the upper insulating layers 145 may be alternately and repeatedly stacked on the substrate 100 in the third direction D3. Thus, a semiconductor device capable of easily increasing an integration density may be provided.

Figure 10:
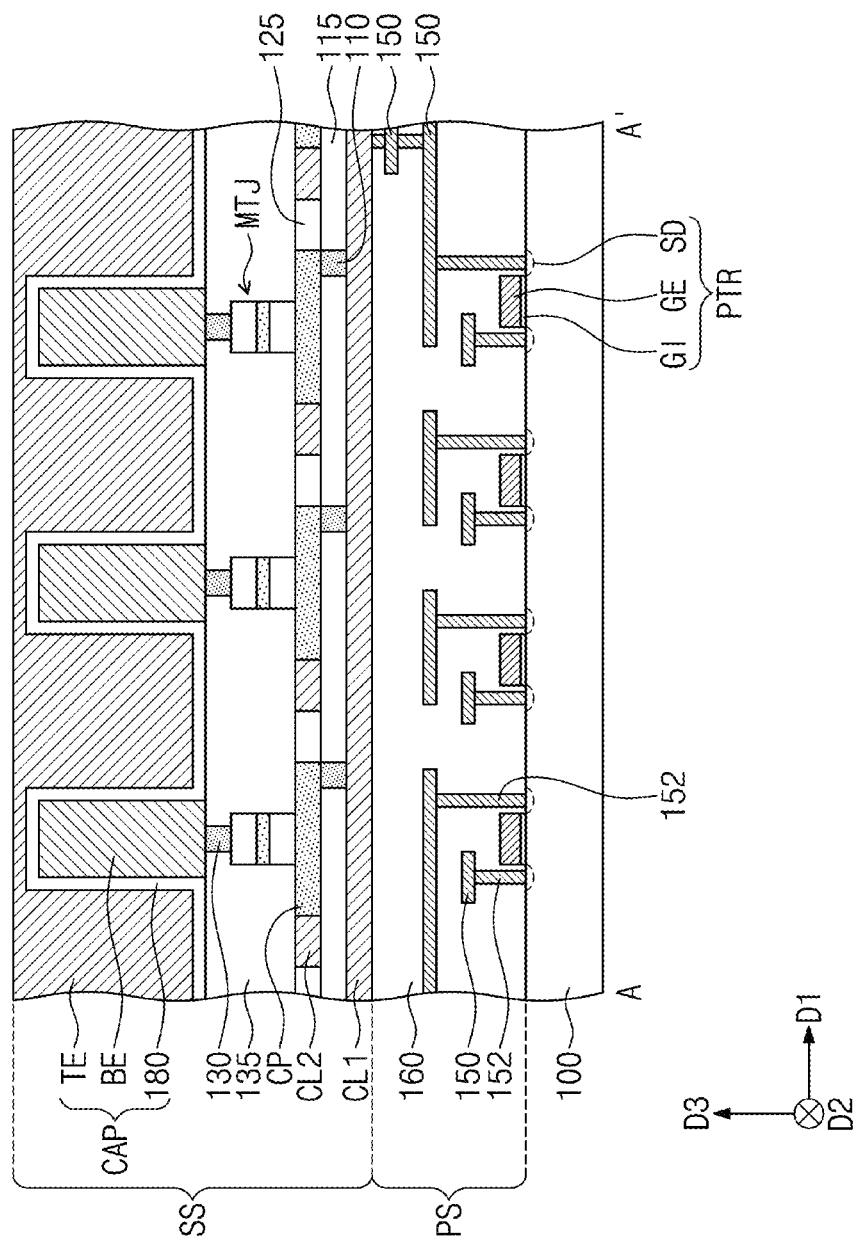
FIG. 10 is a cross-sectional view corresponding to the line A-A' of FIG. 8 to illustrate a semiconductor device according to some example embodiments of inventive concepts.

FIG. 10 is a cross-sectional view corresponding to the line A-A' of FIG. 8 to illustrate a semiconductor device according to some example embodiments of inventive concepts. Hereinafter, differences between example embodiments and embodiments described with reference to FIGS. 8, 9A and 9B will be mainly described for the purpose of ease and convenience in explanation.

Referring to FIGS. 8 and 10, a peripheral circuit structure PS may be disposed between the substrate 100 and the stack structure SS. The peripheral circuit structure PS may include peripheral transistors PTR such as NMOS and/or PMOS transistors on the substrate 100, interconnections 150 and 152 connected to the peripheral transistors PTR, and a peripheral insulating layer 160 covering the peripheral transistors PTR and the interconnections 150 and 152. The peripheral transistors PTR may be, for example, field effect transistors. For example, each of the peripheral transistors PTR may include a gate electrode GE on the substrate 100, a gate insulating layer GI between the gate electrode GE and the substrate 100, and source/drain regions SD at both sides of the gate electrode GE. The interconnections 150 and 152 may include contacts 152 connected to the source/drain regions SD of each of the peripheral transistors PTR, and interconnection lines 150 connected to the contacts 152. The interconnections 150 and 152 may include a conductive material, and the peripheral insulating layer 160 may include, for example, at least one of silicon oxide, silicon nitride, and/or silicon oxynitride.

Each of the lower conductive lines CL1 of the stack structure SS may be electrically connected to a corresponding one of the peripheral transistors PTR in the peripheral circuit structure PS. FIG. 10 illustrates a case in which the number of the stack structure SS stacked on the peripheral circuit structure PS is 1. However, example embodiments of inventive concepts are not limited thereto. As described with reference to FIGS. 8, 9A and 9B, a plurality of the stack structures SS may be stacked on the peripheral circuit structure PS in the third direction D3.

According to some example embodiments of inventive concepts, the peripheral circuit structure PS may be disposed between the stack structure SS and the substrate 100, and thus a semiconductor device capable of easily increasing an integration density may be provided.

Figure 11:
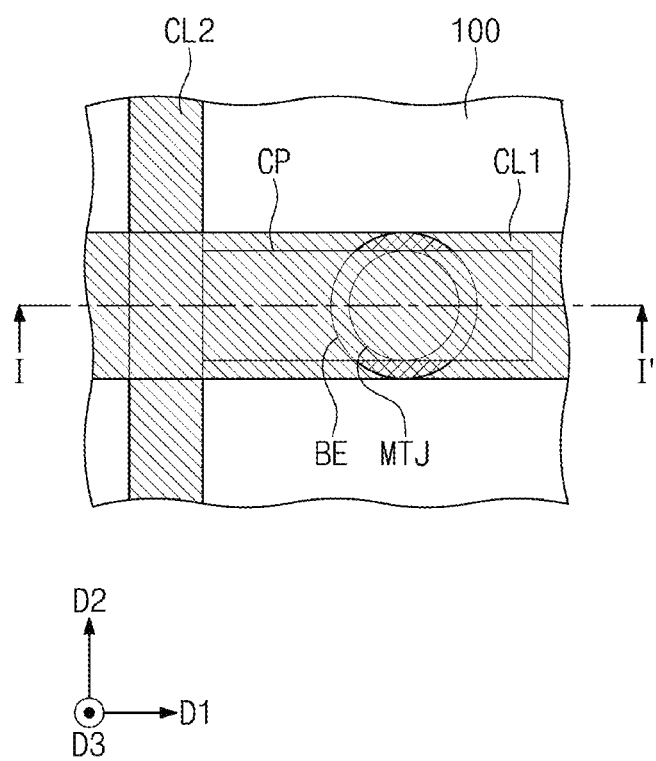
FIG. 11 is a plan view illustrating a semiconductor device according to some example embodiments of inventive concepts.
Figure 12:
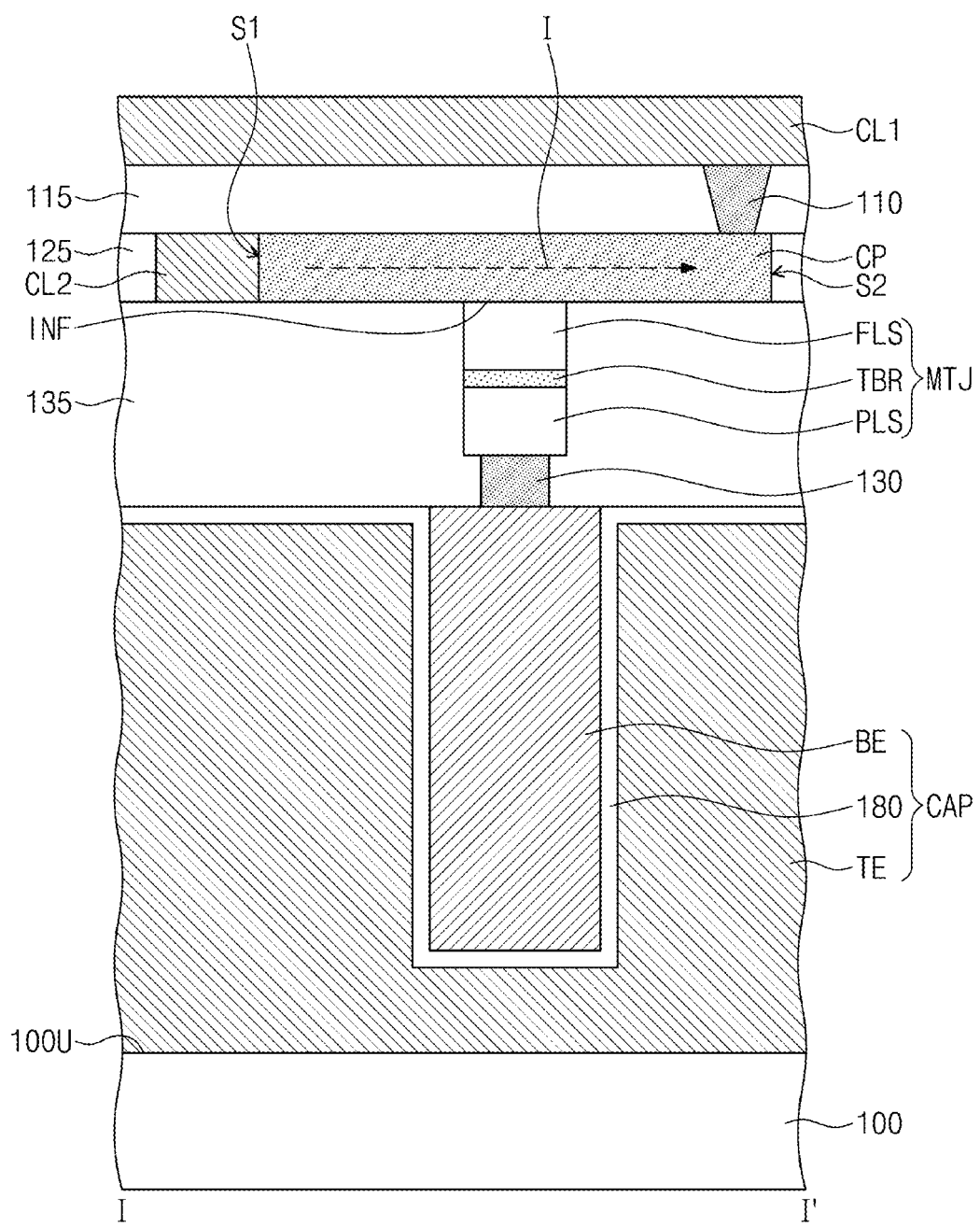
FIG. 12 is a cross-sectional view taken along a line I-I' of FIG. 11.

FIG. 11 is a plan view illustrating a semiconductor device according to some example embodiments of inventive concepts, and FIG. 12 is a cross-sectional view taken along a line I-I' of FIG. 11. Hereinafter, differences between example embodiments and embodiments described with reference to FIGS. 1 to 7 will be mainly described for the purpose of ease and convenience in explanation.

Referring to FIGS. 11 and 12, a capacitor structure CAP may be disposed on a substrate 100. The capacitor structure CAP may include a bottom electrode BE, a top electrode TE covering the bottom electrode BE, and a dielectric layer 180 between the bottom electrode BE and the top electrode TE. The top electrode TE may be disposed between the substrate 100 and the bottom electrode BE and may surround a sidewall of the bottom electrode BE. A third interlayer insulating layer 135 may be disposed on the capacitor structure CAP, and the dielectric layer 180 may extend between the top electrode TE and the third interlayer insulating layer 135.

A magnetic tunnel junction pattern MTJ and a conductive pad 130 may be disposed in the third interlayer insulating layer 135. The conductive pad 130 may be disposed between the magnetic tunnel junction pattern MTJ and the bottom electrode BE. The magnetic tunnel junction pattern MTJ may be electrically connected to the bottom electrode BE through the conductive pad 130. The magnetic tunnel junction pattern MTJ may include a reference magnetic pattern PLS, a tunnel barrier pattern TBR and a free magnetic pattern FLS, which are sequentially stacked in a third direction D3 perpendicular to a top surface 100U of the substrate 100. In some example embodiments, the reference magnetic pattern PLS may be disposed between the tunnel barrier pattern TBR and the conductive pad 130, and the free magnetic pattern FLS may be spaced apart from the reference magnetic pattern PLS with the tunnel barrier pattern TBR interposed therebetween. In some example embodiments, unlike FIG. 12, the free magnetic pattern FLS may be disposed between the tunnel barrier pattern TBR and the conductive pad 130, and the reference magnetic pattern PLS may be spaced apart from the free magnetic pattern FLS with the tunnel barrier pattern TBR interposed therebetween.

A conductive pattern CP may be disposed on the third interlayer insulating layer 135 and may be connected to the magnetic tunnel junction pattern MTJ. The conductive pattern CP may extend in the first direction D1 on the third interlayer insulating layer 135. The conductive pattern CP may be configured to apply spin-orbit torque to the magnetic tunnel junction pattern MTJ. For example, an in-plane current I flowing in the conductive pattern CP may flow in parallel to an interface INF between the conductive pattern CP and the magnetic tunnel junction pattern MTJ. Accordingly, a spin current based on a spin Hall effect (e.g., a quantum spin Hall effect) may flow in a direction substantially perpendicular to the interface INF, and thus the spin-orbit torque may be applied to the magnetic tunnel junction pattern MTJ. The magnetization direction MDf (see FIGS. 3A and 3B) of the free magnetic pattern FLS may be switched by the spin-orbit torque.

An upper conductive line CL2 may be disposed on the third interlayer insulating layer 135 at one side of the conductive pattern CP. The upper conductive line CL2 may extend long in the second direction D2. A contact plug 110 may be disposed on the conductive pattern CP. The conductive pattern CP may have a bar shape, e.g. a rectangular shape, extending long in the first direction D1, and the upper conductive line CL2 and the contact plug 110 may be respectively connected to end portions of the conductive pattern CP, which are opposite to each other in the first direction D1. For example, the conductive pattern CP may have a first sidewall S1 and a second sidewall S2 which are opposite to each other in the first direction D1, and the upper conductive line CL2 and the contact plug 110 may be disposed adjacent to the first sidewall S1 and the second sidewall S2, respectively. The upper conductive line CL2 may be connected to (or in contact with) the first sidewall S1 of the conductive pattern CP, and the contact plug 110 may be connected to (or in contact with) a top surface of the conductive pattern CP, which is close to the second sidewall S2 of the conductive pattern CP. The contact plug 110 may be offset from the magnetic tunnel junction pattern MTJ in the first direction D1, and the upper conductive line CL2 may be offset from the magnetic tunnel junction pattern MTJ in a direction opposite to the first direction D1.

A second interlayer insulating layer 125 may be disposed on the third interlayer insulating layer 135 and may cover sidewalls of the upper conductive line CL2 and the conductive pattern CP. The second interlayer insulating layer 125 may expose top surfaces of the upper conductive line CL2 and the conductive pattern CP. A first interlayer insulating layer 115 may be disposed on the second interlayer insulating layer 125 and may cover the exposed top surfaces of the upper conductive line CL2 and the conductive pattern CP. The contact plug 110 may penetrate the first interlayer insulating layer 115 so as to be connected to the conductive pattern CP.

A lower conductive line CL1 may be disposed on the first interlayer insulating layer 115 and may extend long in the first direction D1. The lower conductive line CL1 may be electrically connected to the conductive pattern CP through the contact plug 110.

According to some example embodiments, the capacitor structure CAP may be disposed between the substrate 100 and the spin-orbit torque-based switching element including the conductive pattern CP and the magnetic tunnel junction pattern MTJ. Except for the above differences, other features of a unit memory cell of a semiconductor device according to the present embodiments may be substantially the same as corresponding features of the unit memory cell of the semiconductor device described with reference to FIGS. 1 to 7.

According to some example embodiments of inventive concepts, the unit memory cell of the semiconductor device may include the spin-orbit torque-based switching element including the conductive pattern and the magnetic tunnel junction pattern, and the capacitor structure controlled by the spin-orbit torque-based switching element. The amount of charges charged into the capacitor structure may be controlled depending on the resistance state of the magnetic tunnel junction pattern, and thus the unit memory cell may perform the multi-bit operation. A unit memory cell of the semiconductor device may not include an access transistor. A unit memory cell of the semiconductor device may include or consist of a 1MTJ-1C unit memory cell. Alternatively or additionally, the unit memory cells may be horizontally and vertically stacked on the substrate, and thus the integration density of the semiconductor device may be more easily increased.

While inventive concepts have been described with reference to example embodiments, it will be apparent to those skilled in the art that various changes and modifications may be made without departing from the spirits and scopes of inventive concepts. Therefore, it should be understood that the above example embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A semiconductor device comprising:
   a conductive pattern extending in a first direction, the conductive pattern having a first end portion and a second end portion opposite to each other in the first direction;
   a magnetic tunnel junction pattern on the conductive pattern;
   a capacitor on the magnetic tunnel junction pattern;
   an upper conductive line connected to the first end portion of the conductive pattern; and
   a contact plug connected to the second end portion of the conductive pattern, wherein
   the magnetic tunnel junction pattern is between the conductive pattern and the capacitor,
   the magnetic tunnel junction pattern connects to the capacitor, and the conductive pattern is configured to apply spin-orbit torque to the magnetic tunnel junction pattern, and
   the contact plug is offset from the magnetic tunnel junction pattern in the first direction, such that the contact plug is adjacent to the second end portion of the conductive pattern, and the upper conductive line is offset from the magnetic tunnel junction pattern in a direction opposite to the contact plug in the first direction, such that the upper conductive line is adjacent to a sidewall of the first end portion of the conductive pattern.

2. The semiconductor device of claim 1, wherein the capacitor comprises: a bottom electrode;
   a top electrode; and
   a dielectric layer between the bottom electrode and the top electrode,
   wherein the magnetic tunnel junction pattern connects to the bottom electrode of the capacitor.

3. The semiconductor device of claim 2, further comprising:
   a conductive pad between the magnetic tunnel junction pattern and the bottom electrode.

4. The semiconductor device of claim 1, wherein
   the upper conductive line is at one side of the conductive pattern and extending in a second direction that intersects the first direction.

5. The semiconductor device of claim 4, further comprising:
   a lower conductive line apart from the magnetic tunnel junction pattern with the conductive pattern between the lower conductive line and the magnetic tunnel junction pattern,
   wherein the contact plug is between the conductive pattern and the lower conductive line.

6. The semiconductor device of claim 1, wherein the magnetic tunnel junction pattern comprises:
   a free magnetic pattern;
   a reference magnetic pattern; and
   a tunnel barrier pattern between the free and reference magnetic patterns,
   wherein the free magnetic pattern is between the tunnel barrier pattern and the conductive pattern.

7. The semiconductor device of claim 6, wherein magnetization directions of the free magnetic pattern and the reference magnetic pattern are at least one of substantially perpendicular to an interface between the free magnetic pattern and the conductive pattern or substantially parallel to the interface between the free magnetic pattern and the conductive pattern.

8. The semiconductor device of claim 1, wherein the conductive pattern includes at least one of a heavy metal, a material doped with a heavy metal, or a topological insulator.

9. A semiconductor device comprising:
a capacitor on a substrate;
a magnetic tunnel junction pattern between the substrate and the capacitor and connected to the capacitor; and
a conductive pattern between the substrate and the magnetic tunnel junction pattern,
wherein the capacitor comprises,
a bottom electrode connected to the magnetic tunnel junction pattern,
a top electrode covering top and side surfaces of the bottom electrode in a direction perpendicular to an upper surface of the substrate, and
a dielectric layer between the top and side surfaces of the bottom electrode and the top electrode,
wherein the conductive pattern has a bar shape extending in a first direction that is parallel to a top surface of the substrate.

10. The semiconductor device of claim 9, further comprising:
an upper conductive line at one side of the conductive pattern,
wherein the conductive pattern has a first sidewall and a second sidewall opposite to the first sidewall in the first direction, and
the upper conductive line connects to the first sidewall of the conductive pattern.

11. The semiconductor device of claim 10, wherein the upper conductive line extends in a second direction which is parallel to the top surface of the substrate and which intersects the first direction.

12. The semiconductor device of claim 10, further comprising:
a lower conductive line between the substrate and the conductive pattern and extending in the first direction; and
a contact plug connecting the conductive pattern to the lower conductive line,
wherein the contact plug is close to the second sidewall of the conductive pattern.

13. The semiconductor device of claim 12, wherein the contact plug is offset from the magnetic tunnel junction pattern in the first direction, and the upper conductive line is offset from the magnetic tunnel junction pattern in a direction opposite to the first direction.

14. The semiconductor device of claim 9, wherein the magnetic tunnel junction pattern comprises:
a free magnetic pattern;
a reference magnetic pattern; and
a tunnel barrier pattern between the free and reference magnetic patterns,
wherein one of the free magnetic pattern and the reference magnetic pattern is between the tunnel barrier pattern and the conductive pattern, and
the other of the free magnetic pattern and the reference magnetic pattern is between the bottom electrode and the tunnel barrier pattern.

15. The semiconductor device of claim 9, wherein the conductive pattern is configured to apply spin-orbit torque to the magnetic tunnel junction pattern by a current that is parallel to an interface between the magnetic tunnel junction pattern and the conductive pattern.

16. The semiconductor device of claim 9, wherein the conductive pattern includes at least one of a heavy metal, a material doped with a heavy metal, or a topological insulator.

17. The semiconductor device of claim 9, further comprising:
a conductive pad between the magnetic tunnel junction pattern and the bottom electrode.

18. A semiconductor device comprising:
a lower conductive line on a substrate and extending in a first direction that is parallel to a top surface of the substrate;
a plurality of contact plugs on the lower conductive line and spaced apart from each other in the first direction;
a plurality of conductive patterns on the plurality of contact plugs, respectively, and spaced apart from each other in the first direction;
a plurality of magnetic tunnel junction patterns on the plurality of conductive patterns, respectively; and
a capacitor on the magnetic tunnel junction patterns,
wherein the capacitor includes a plurality of bottom electrodes apart from each other in the first direction, and
the magnetic tunnel junction patterns connect to the bottom electrodes, respectively.

19. The semiconductor device of claim 18, wherein each of the conductive patterns has a bar shape extending in the first direction.

20. The semiconductor device of claim 19, further comprising:
a plurality of upper conductive lines on the lower conductive line and intersecting the lower conductive line,
wherein the upper conductive lines are apart from each other in the first direction and extend in a second direction which is parallel to the top surface of the substrate and intersects the first direction, and
the upper conductive lines connect to the conductive patterns, respectively.

* * * * *